US012772397B2

(12) United States Patent
Johnson et al.

(10) Patent No.: US 12,772,397 B2
(45) Date of Patent: Oct. 20, 2026

(54) ADJUSTABLE POLYCARBONATE BARRIER

(71) Applicant: Vertiv Corporation, Westerville, OH (US)

(72) Inventors: Logan Johnson, New Bloomington, OH (US); Carl Caldwell, Cardington, OH (US); John Nelson Van Fossen, Powell, OH (US)

(73) Assignee: Vertiv Corporation, Westerville, OH (US)

( * ) Notice: Subject to any disclaimer, the term of this patent is extended or adjusted under 35 U.S.C. 154(b) by 222 days.

(21) Appl. No.: 18/645,546

(22) Filed: Apr. 25, 2024

(65) Prior Publication Data

US 2024/0365491 A1 Oct. 31, 2024

Related U.S. Application Data

(60) Provisional application No. 63/498,030, filed on Apr. 25, 2023.

(51) Int. Cl.
*H05K 5/02* (2006.01)
*H05K 7/14* (2006.01)

(52) U.S. Cl.
CPC ......... *H05K 5/0247* (2013.01); *H05K 7/1405* (2013.01)

(58) Field of Classification Search
None
See application file for complete search history.

(56) References Cited

U.S. PATENT DOCUMENTS 5,627,720 A * 5/1997 Lewis .................... H02B 1/056 361/627
6,943,297 B2 * 9/2005 Capella ............. H01R 13/4534 174/67
7,075,004 B1 * 7/2006 Gretz ..................... H02G 3/121 439/535
7,279,635 B2 * 10/2007 Hyde ..................... H02G 3/123 439/598
7,304,236 B1 * 12/2007 Gretz ....................... H02G 3/18 361/600
7,825,336 B2 * 11/2010 Peck ...................... H02G 3/121 174/64
8,476,525 B1 * 7/2013 Gretz ....................... H02G 3/12 174/63
8,569,619 B2 * 10/2013 Gretz ..................... H02G 3/121 174/58

(Continued)

FOREIGN PATENT DOCUMENTS

CN 106207833 A * 12/2016 ............ E05B 65/52
CN 218850159 U * 4/2023

*Primary Examiner* — Xanthia C Relford
(74) *Attorney, Agent, or Firm* — Suiter Swantz IP

(57) ABSTRACT

In an embodiment, the present disclosure is directed towards a polycarbonate barrier for the isolation of electrical components. The polycarbonate barrier includes a rectangular shield and a connection plate. The rectangular shield includes an internal side, an external side, an external top wall, an internal bottom wall, and at least one side wall. The connection plate includes a left connection piece, a right connection piece, at least one connection tab, and at least one adapter piece. If desired, the adapter piece can be removed to accommodate an electrical component.

16 Claims, 6 Drawing Sheets

(56) References Cited

U.S. PATENT DOCUMENTS

| | | | | |
|---|---|---|---|---|
| 8,772,649 B1* | 7/2014 | Gretz | H02G 3/123 | 174/53 |
| 8,963,000 B2* | 2/2015 | Xiao | H02G 3/16 | 174/548 |
| 9,748,751 B1* | 8/2017 | Gretz | H02G 3/10 | |
| 10,236,665 B2* | 3/2019 | Groner | H02B 1/306 | |
| 10,737,273 B2* | 8/2020 | Motadel | B01L 9/543 | |
| 10,820,453 B2* | 10/2020 | Zhu | H05K 7/202 | |
| 2010/0075590 A1* | 3/2010 | Rico | H05K 7/20127 | 454/367 |
| 2010/0258578 A1* | 10/2010 | Motadel | G01N 35/04 | 221/92 |
| 2011/0236278 A1* | 9/2011 | Motadel | B01L 9/543 | 422/560 |
| 2012/0067613 A1* | 3/2012 | Yu | H01R 13/113 | 439/864 |
| 2016/0061417 A1* | 3/2016 | Kim | G02B 6/0026 | 349/62 |
| 2016/0241007 A1* | 8/2016 | Tremaine | H01R 9/2416 | |

* cited by examiner

ADJUSTABLE POLYCARBONATE BARRIER

BACKGROUND

The present invention relates to power distribution cabinets, and more particularly, this invention relates to a physical barrier to provide safe separation between high voltage and low voltage areas of a cabinet.

Power distribution units (PDUs) are widely used in electrical systems and data centers to manage and distribute electrical power from a source to various devices. PDUs often consist of busbars, switches, and other powered components that are mounted within the housing of the PDU. Physical barriers are often required within the housing of the PDU to ensure safe operation and maintenance. These barriers provide protection against electrical hazards and serves as a physical barrier to prevent accidental contact with energized parts within the PDU.

In the past, different size and thicknesses of busbars, switches, and othered power components required different types of barriers to accommodate them. This posed a significant challenge to companies that needed to stock a variety of barriers to meet the needs of their diverse electrical systems. Such diversity of barriers can cause complexity in inventory management and procurement processes, ultimately leading to higher costs.

The present invention overcomes this challenge by providing a removable piece of the barrier, which allows different sizes and thicknesses of busbars, switches, and other powered components to be used with a single barrier. The removable piece of the barrier has a flexible design that can be adapted to fit a wide range of component size and thicknesses. The inventive concept allows for greater flexibility in the selection and management of barrier inventory, reducing costs and simplifying the procurement process for companies.

The polycarbonate barrier of the present invention is designed to provide superior protection against electrical hazards and to meet relevant safety standards. Overall, the present invention provides a significant improvement in the design and functionality of polycarbonate barriers for PDUs, offering a cost-effective and flexible solution that meets the needs of a wide range of electrical systems.

BRIEF DESCRIPTION OF THE DRAWINGS

The detailed description is described with reference to the accompanying figures.

SUMMARY

This section provides a general summary of the disclosure and is not a comprehensive disclosure of its full scope or all of its features.

In an embodiment, the present disclosure is directed towards a polycarbonate barrier for the isolation of electrical components. The polycarbonate barrier includes a rectangular shield and a connection plate. The rectangular shield includes an internal side, an external side, an external top wall, an internal bottom wall, and at least one side wall. The connection plate includes a left connection piece, a right connection piece, at least one connection tab, and at least one adapter piece. If desired, the adapter piece can be removed to accommodate an electrical component.

DETAILED DESCRIPTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete and will fully convey the scope. The following detailed description is, therefore, not to be taken in a limiting sense.

Figure 1:
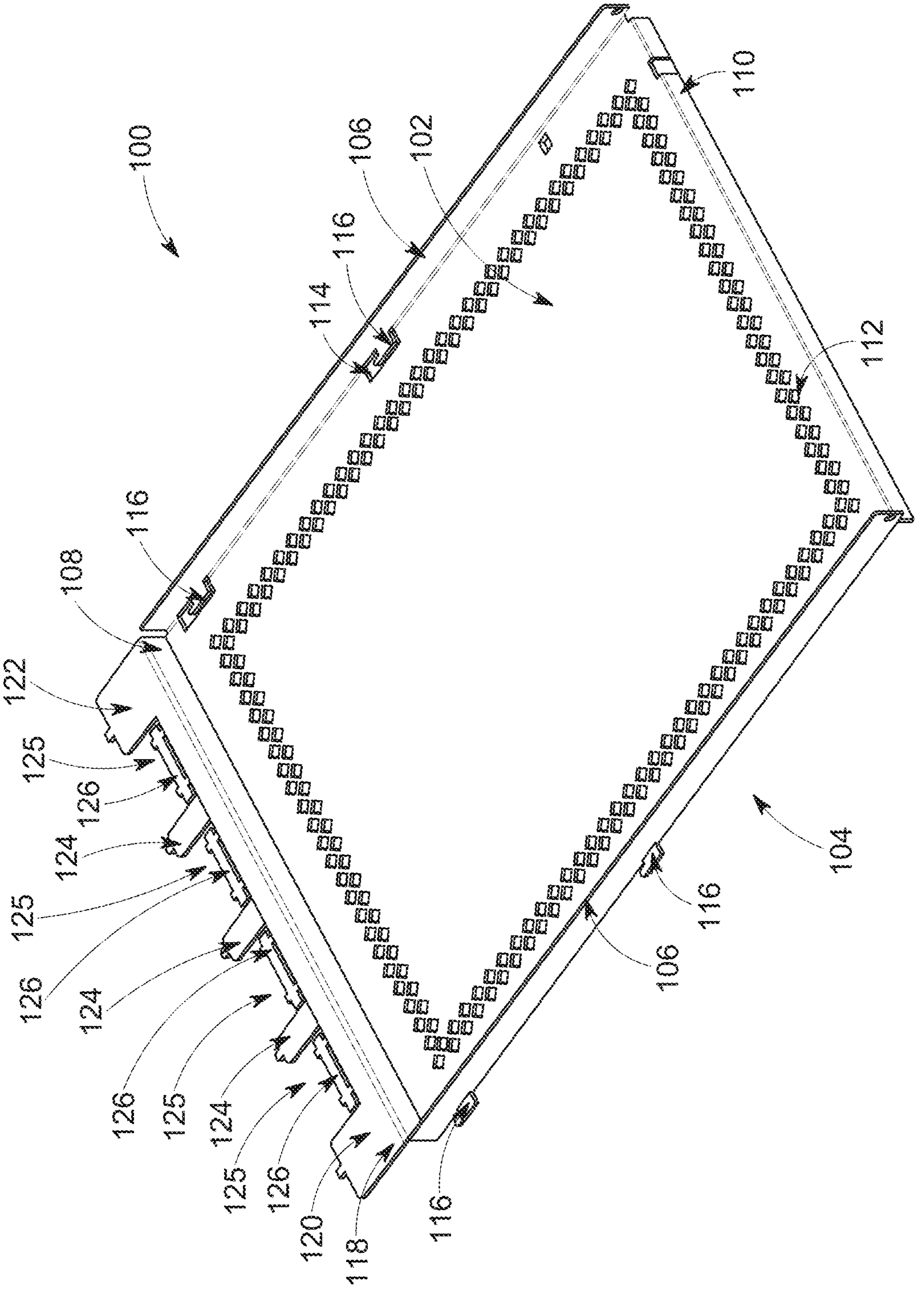
FIG. 1 is an orthogonal view of a preferred embodiment of the polycarbonate barrier.

FIG. 1 illustrates a perspective view of a polycarbonate barrier for use in a power distribution unit. The polycarbonate barrier 100 includes an internal side 102 and an external side 104. In a preferred embodiment, the internal side 102 faces the internal components of a power distribution unit, while the external side 104 faces away from the internal components of a power distribution unit. The polycarbonate barrier 100 further includes side walls 106, an exterior top wall 108, and an interior bottom wall 110. In a preferred embodiment, the side walls 106 extend upwardly from the external side 104 at a 90-degree angle. In a preferred embodiment, the interior bottom wall 100 extends outward from the internal side 102 at a 90-degree angle.

The polycarbonate barrier 100 can further include at least one airflow opening 112. The airflow opening 112 can extend through the polycarbonate barrier 100 from the internal side 102 to the external side 104. In the present embodiment, each airflow opening 112 is in the shape of a diamond with an approximate side length of 5 mm. However, it is to be understood that the airflow opening 112 can be any size and shape so long as it allows air to freely flow through it.

The polycarbonate barrier 100 can further include at least one hook opening 114 and at least one hook 116. In the present embodiment, the hook opening 114 extends from the internal side 102 to the external side 104 and can be located along the edge of the polycarbonate barrier where the side walls 106 meet the external side 104. At least one hook 116 extends from the side walls 106 towards the internal side 102. In the present embodiment, the hook 116 is shaped like an "L" to ensure that the polycarbonate barrier 100 securely fits on the casing of a PDU. However, the hook 116 can be any shape that allows the polycarbonate barrier 100 to securely fasten to the casing of a PDU. In an exemplary embodiment, the hooks 116 exist in pairs on each opposing side wall, however it is to be understood that the hook 116 can exist in any number required to sufficiently fit on the casing of a PDU.

The polycarbonate barrier 100 further includes a connection plate 118 extending from the exterior top wall 108. In the present embodiment, the connection plate 118 extends away from the internal side 102 and external side 104 at a 90-degree angle relative to the exterior top wall 108. The connection plate 118 further includes a left connection piece

120 and a right connection piece 122. The left and right connection pieces 120, 122 can be configured to be the size and shape required to connect with a power distribution unit. The connection plate 118 further includes at least one connection tab 124 between the left connection piece 120 and the right connection piece 122.

As further depicted in FIG. 1, the pieces 120, 122, 124 cooperate to form a void 125 with a distance extending away from the connection plate 118. The polycarbonate barrier 100 further includes at least one adapter piece 126 that can be located in one or more of the voids 125 between the left and right connection pieces 120, 122. The adapter piece 126 can also be located in one or more of the voids between two connection tabs 124. The adapter piece 126 can be attached to multiple connection tabs 124 or a single connection tab 124 and either the left or right connection pieces, 120, 122. In the present embodiment, the length of the adapter piece 126 is less than that of the left and right connection pieces 120, 122 and connection tabs 124. The adapter piece 126 can be configured to be removable from the connection plate 118. When removed, the adapter piece 126 enlarges the void 125 by a dimension extending away from the connection plate 118.

Figure 2:
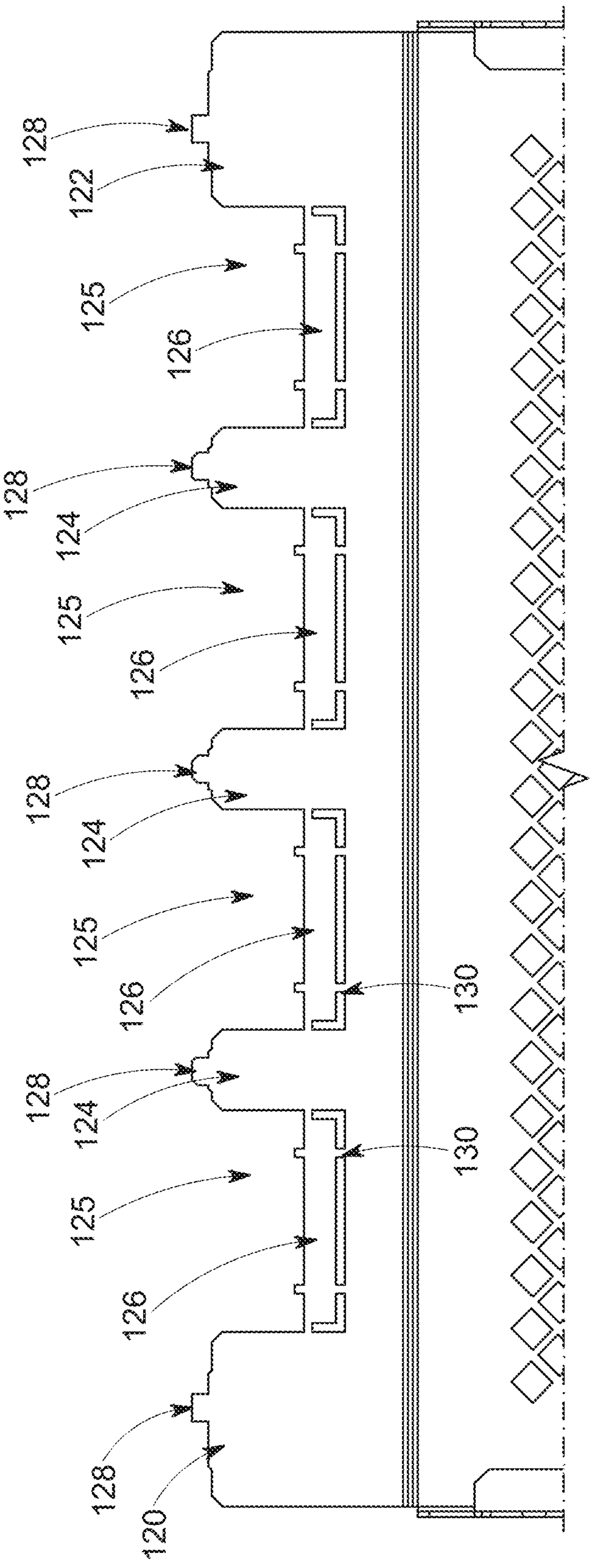
FIG. 2 is a top view of a preferred embodiment of the polycarbonate barrier with the removable piece.

FIG. 2 illustrates a detailed view of the connection plate 118. The left and right connection pieces 120, 122 and the connection tabs 124 further include mating points 128. In the present embodiment, the mating points 128 are configured to be inserted into a respective attachment point on a power distribution unit, such that the mating point 128 helps secure the polycarbonate barrier 100 to the power distribution unit. While the present depictions shows a single mating point 128 on each of the left and right connection pieces 120, 122 and the connection tabs 124, it is to be understood that any number of mating points 128 can be placed on the distal tips of the left and right connection pieces 120, 122 and connection tabs 124.

FIG. 2 further illustrates at least one attachment point 130. Each attachment point 130 exists where the adapter piece 126 connects with the connection plate 118. The dimensions of each attachment point 130 are selected to allow a user to remove the adapter piece 126. A user can manually break off the adapter piece 126 at all of its respective attachment points 130. When a user removes an attachment point 130, the size of void 125 and in particular the size of the void 125 extending away from the connection plate 118 is increased.

Figure 3:
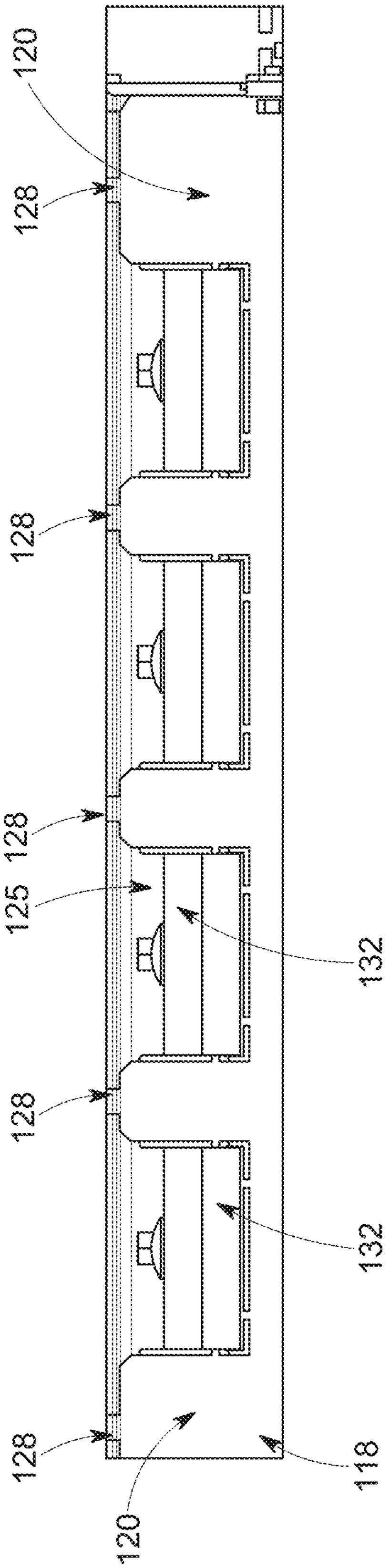
FIG. 3 is a top view of a preferred embodiment of the polycarbonate barrier with a double stacked busbar.

FIG. 3 illustrates an alternative detailed view of the connection plate 118. In this exemplary embodiment, there are two busbars 132 stacked on top of one another and placed within the void 125. To accommodate two busbars 132, all of the adapter pieces 126 are removed from the connection plate 118. It is to be understood that while a busbar is illustrated in this exemplary embodiment, any electrical system can be placed within the connection plate 118. It is further understood that the configuration of two busbars 132 stacked on top of one another can be known as a double stacked busbar. In some embodiments, one attachment piece 126 can be removed from the connection plate 118 to accommodate a single busbar in the void 125.

Figure 4:
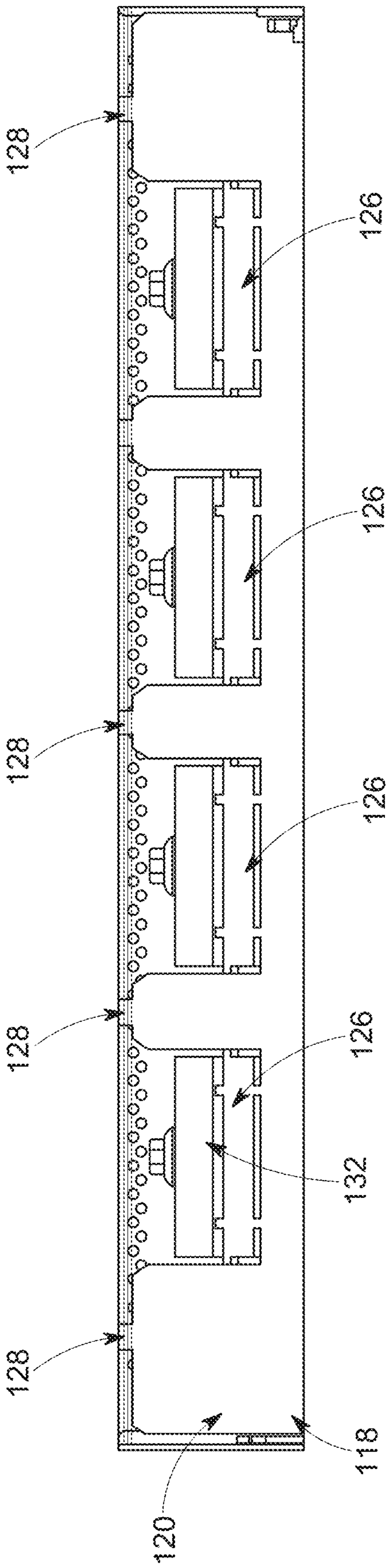
FIG. 4 is a top view of a preferred embodiment of the polycarbonate barrier with a single busbar.

FIG. 4 illustrates a second alternative detailed view of the connection plate 118. In this exemplary embodiment, there is a single busbar 132 placed within the connection plate 118. Since a single busbar 132 is able to fit within the connection plate 118 without the removal of the adapter pieces 126, the adapter pieces do not need to be removed in order to accommodate the single busbar. It is to be understood that while a busbar is illustrated in this exemplary embodiment, any electrical system with the requisite width can be placed within the connection plate 118. It is further understood that the configuration of two busbars 132 stacked on top of one another can be known as a double stacked busbar.

Figure 5:
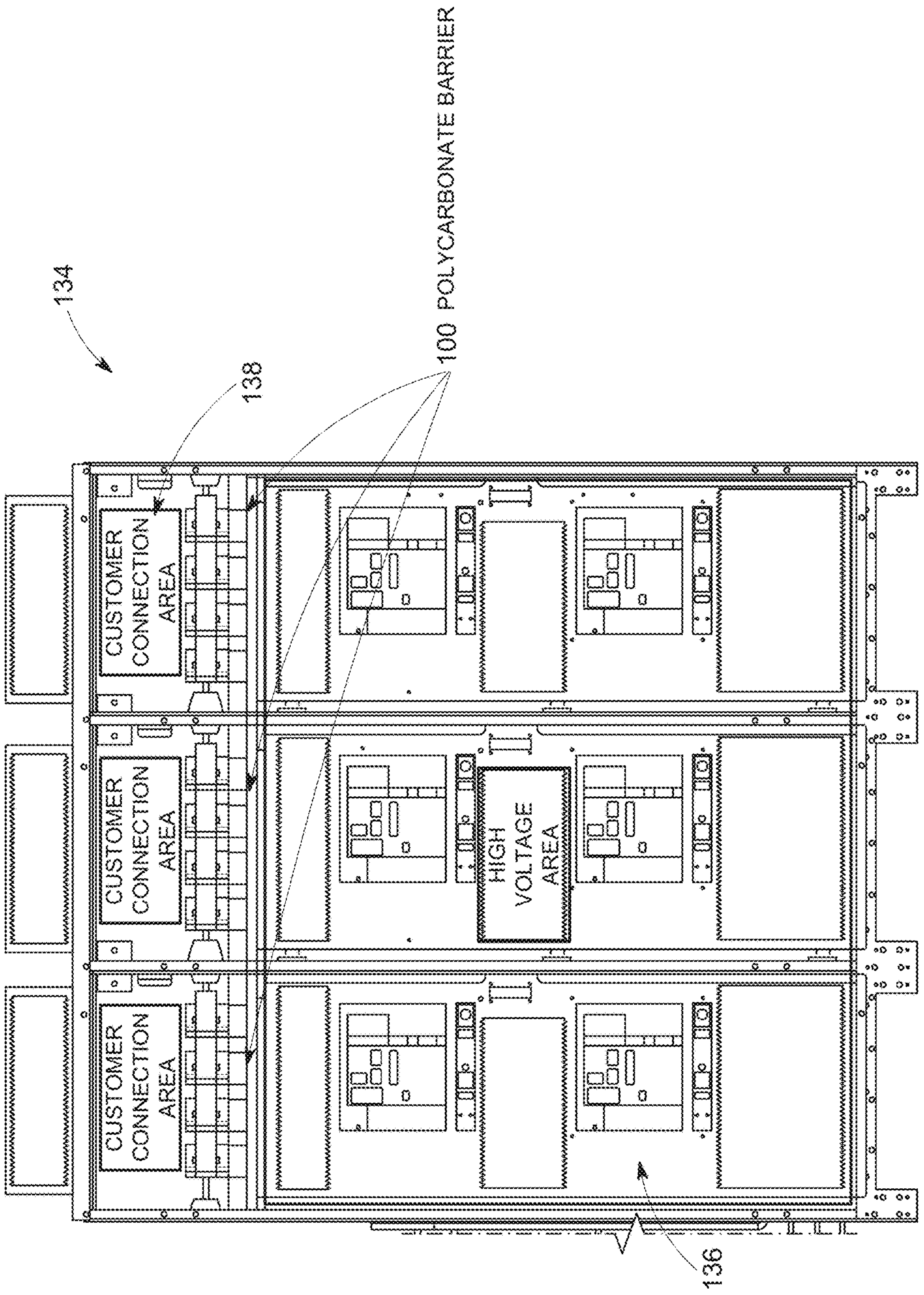
FIG. 5 is a front perspective view of a cabinet incorporating the polycarbonate barrier of FIG. 3.

FIG. 5 illustrates a first perspective view of a cabinet incorporating the polycarbonate barrier 100 of FIG. 3. In a preferred embodiment, the cabinet 134 incorporates a PDU. The cabinet 134 includes a high voltage space 136 and a low voltage space 138. It is further understood that the low voltage space 138 can be known as a customer connection area. For example, a user may want to access components within the customer connection area 138. These components can be electrical components, busbar connection points, cabling, or any low voltage component. A user typically will not need access to the high voltage area 136, where there can exist multiple high voltage electrical devices that, when electrically powered, can be dangerous and require certification to access and perform maintenance on. As shown therein, the polycarbonate barrier 100 provides for a rigid and electrically insulating physical barrier that prevents a user from intentionally or inadvertently accessing the high voltage space 136. It is further understood that the high voltage space 136 can be known as an internal component area. These internal components can be energized while a user is working on components within the customer connection area 138. It is to be further understood, however, that components within the internal component area 136 may not be considered "high voltage."

Figure 6:
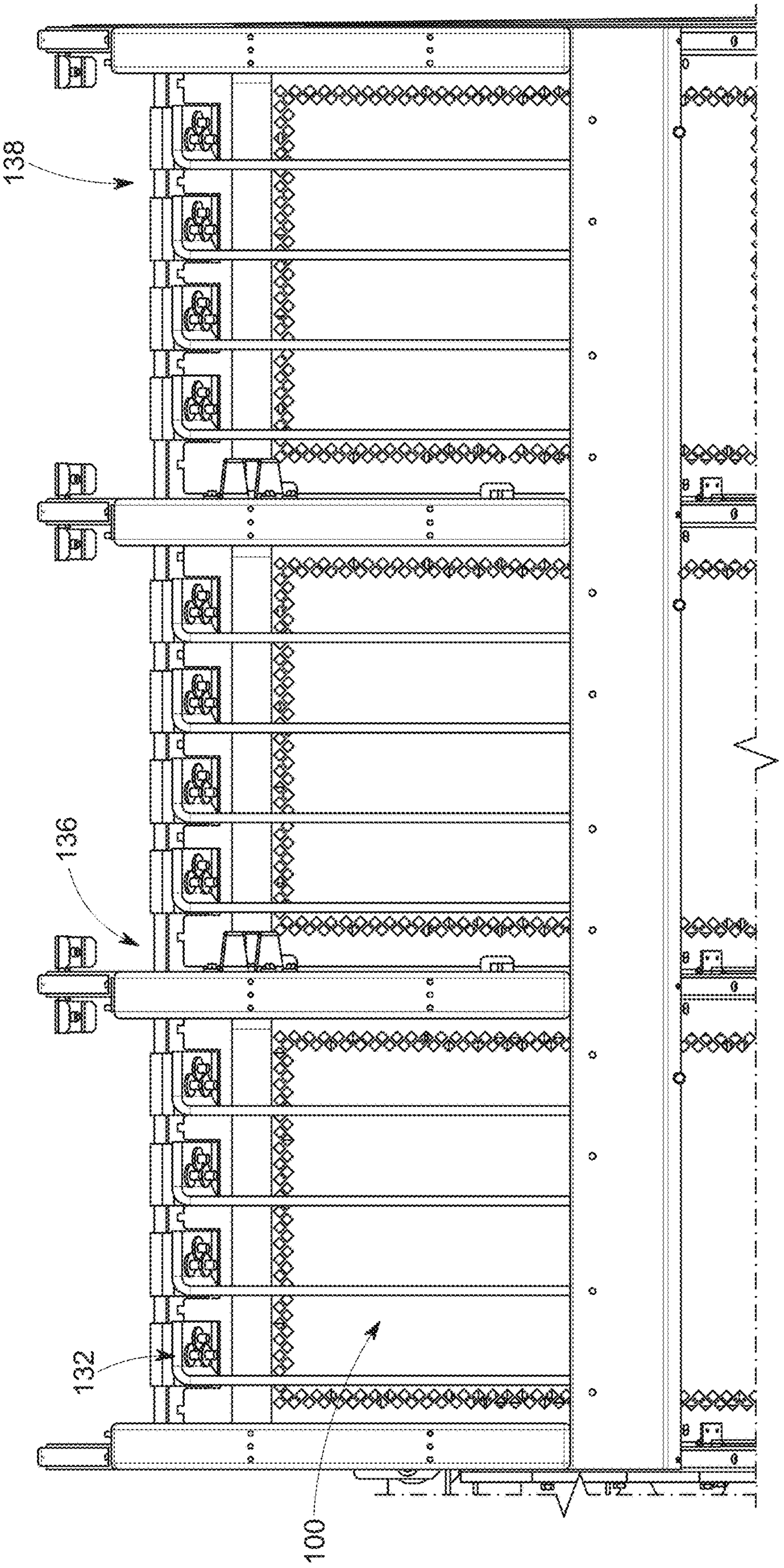
FIG. 6 is a top view of a cabinet incorporating the polycarbonate barrier of FIG. 4.

FIG. 6 illustrates a top view of a cabinet incorporating the polycarbonate barrier 100 of FIG. 3. The polycarbonate barrier 100 can be placed between the high voltage space 136 and the low voltage space 138. As shown in this exemplary embodiment, the adapter pieces 126 are removed from the polycarbonate barrier 100, allowing for a double stacked busbar to pass from the high voltage space 136 to the low voltage space 138. It is to be understood that the adapter piece 126 can remain attached to the polycarbonate barrier 100, which would allow a single busbar to pass from the high voltage space 136 to the low voltage space 138. It is to be further understood that any type of desired component may pass from the high voltage space 136 to the low voltage space 138 through the void 125 created by the polycarbonate barrier 100.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed is:

1. A polycarbonate barrier for isolation of electrical components, the polycarbonate barrier comprising:
- a rectangular shield plate comprising:
  - an internal side;
  - an external side;
  - an exterior top wall;
  - an interior bottom wall; and
  - at least one side wall; and
- a connection plate extending from the exterior top wall, the connection plate comprising:
  - a left connection piece;
  - a right connection piece;
  - at least one connection tab; and
  - at least one adapter piece located in a void between the left connection piece and the right connection piece, wherein the at least one adapter piece connects with the connection plate via at least one attachment point;
  - wherein the at least one adapter piece is configured to be removed at the at least one attachment point to accommodate an electrical component,
  - wherein the connection plate further defines the void between the left connection piece and the right connection piece, and wherein the void is enlarged by a dimension equivalent to the at least one adapter piece when the at least one adapter piece is removed.

2. The polycarbonate barrier of claim 1, wherein the at least one side wall defines a plurality of hooks.

3. The polycarbonate barrier of claim 2, wherein the plurality of hooks are configured to securely fit on a casing of the electrical component.

4. The polycarbonate barrier of claim 1, wherein the at least one side wall defines a plurality of cavities extending from the internal side to the external side.

5. The polycarbonate barrier of claim 1, further comprising at least one airflow opening extending through the polycarbonate barrier from the internal side to the external side.

6. The polycarbonate barrier of claim 1, wherein the polycarbonate barrier can be configured to accommodate electrical components of varying sizes.

7. The polycarbonate barrier of claim 1, wherein the polycarbonate barrier is configured to be used with the electrical component that is a power distribution unit.

8. The polycarbonate barrier of claim 1, wherein the connection plate further comprises mating points configured to secure the polycarbonate barrier.

9. The polycarbonate barrier of claim 8, wherein the mating points are located distally on the left connection piece and the right connection piece.

10. An electrical component isolation system comprising:
- a high voltage area;
- a low voltage area; and
- a polycarbonate barrier, wherein the polycarbonate barrier is configured to provide a physical barrier between the high voltage area and the low voltage area,
- wherein the polycarbonate barrier comprises a connection plate, the connection plate comprising:
  - a left connection piece;
  - a right connection piece;
  - at least one connection tab; and
  - at least one adapter piece located in a void between the left connection piece and the right connection piece, wherein the at least one adapter piece connects with the connection plate via at least one attachment point;
  - wherein the at least one adapter piece is configured to be removed at the at least one attachment point to allow passage of an electrical component from the high voltage area to the low voltage area, and wherein the void is enlarged by a dimension equivalent to the at least one adapter piece when the at least one adapter piece is removed.

11. The system of claim 10, wherein the electrical component is a busbar.

12. A method for isolating electrical components within a cabinet, the method comprising:
- providing a polycarbonate barrier comprising a connection plate, the connection plate comprising:
  - a left connection piece;
  - a right connection piece;
  - at least one connection tab; and
  - at least one adapter piece located in a void between the left connection piece and the right connection piece, wherein the at least one adapter piece connects with the connection plate via at least one attachment point;
- attaching the polycarbonate barrier to a housing of the cabinet to separate a high voltage area and a low voltage area; and
- adjusting the at least one adapter piece of the polycarbonate barrier to accommodate different sizes of an electrical component,
- wherein the at least one adapter piece is configured to be removed at the at least one attachment point to accommodate the electrical component, and wherein the void is enlarged by a dimension equivalent to the at least one adapter piece when the at least one adapter piece is adjusted.

13. The method of claim 12, wherein attaching the polycarbonate barrier to the housing of the cabinet further comprises using a hook that can engage with the housing.

14. The method of claim 12, wherein the electrical component is a single busbar.

15. The method of claim 12, wherein the electrical component is a double stacked busbar.

16. The method of claim 12, further including providing an airflow through at least one opening in the polycarbonate barrier to reduce a temperature of the electrical component.

* * * * *